United States Patent
Schaber et al.

(10) Patent No.: US 6,772,382 B2
(45) Date of Patent: Aug. 3, 2004

(54) DRIVER FOR INTEGRATED CIRCUIT CHIP TESTER

(75) Inventors: Scott D. Schaber, Roseville, MN (US); Scott C. Loftsgaarden, Shoreview, MN (US)

(73) Assignee: Teradyne, Inc., Boston, MA (US)

( * ) Notice: Subject to any disclaimer, the term of this patent is extended or adjusted under 35 U.S.C. 154(b) by 610 days.

(21) Appl. No.: 09/847,263

(22) Filed: May 2, 2001

(65) Prior Publication Data

US 2003/0028832 A1 Feb. 6, 2003

(51) Int. Cl.[7] .................... G01R 31/317; H03K 19/00
(52) U.S. Cl. ..................... 714/744; 326/93; 326/94
(58) Field of Search ................. 714/744; 326/93–98

(56) References Cited

U.S. PATENT DOCUMENTS

| | | | |
|---|---|---|---|
| 5,321,702 A | * | 6/1994 | Brown et al. ............... 714/744 |
| 6,038,254 A | * | 3/2000 | Ferraiolo et al. ........... 375/232 |
| 6,052,810 A | | 4/2000 | Creek |
| 6,430,725 B1 | * | 8/2002 | Reichle et al. .............. 714/815 |
| 6,457,114 B1 | * | 9/2002 | Paluch ....................... 711/219 |
| 6,580,880 B1 | * | 6/2003 | Regelsberger et al. ........ 399/31 |

* cited by examiner

Primary Examiner—R. Stephen Dildine
(74) Attorney, Agent, or Firm—Fogg and Associates, LLC; Scott V. Lundberg

(57) ABSTRACT

A driver circuit for use on an integrated circuit tester. In one embodiment, the driver circuit has a timing circuit and a driver. The timing circuit has two or more inputs to receive data signals at a first frequency and at least one output. The timing circuit generates a control signal having a second higher frequency and outputs signals based on the data signals and the control signal such that the output signals are independent of the effects of timing skew and timing jitter of the data signals. The driver has at least one input coupled to the at least one output of the timing circuit to receive the output signals and couple the output signals to a device under test.

45 Claims, 8 Drawing Sheets

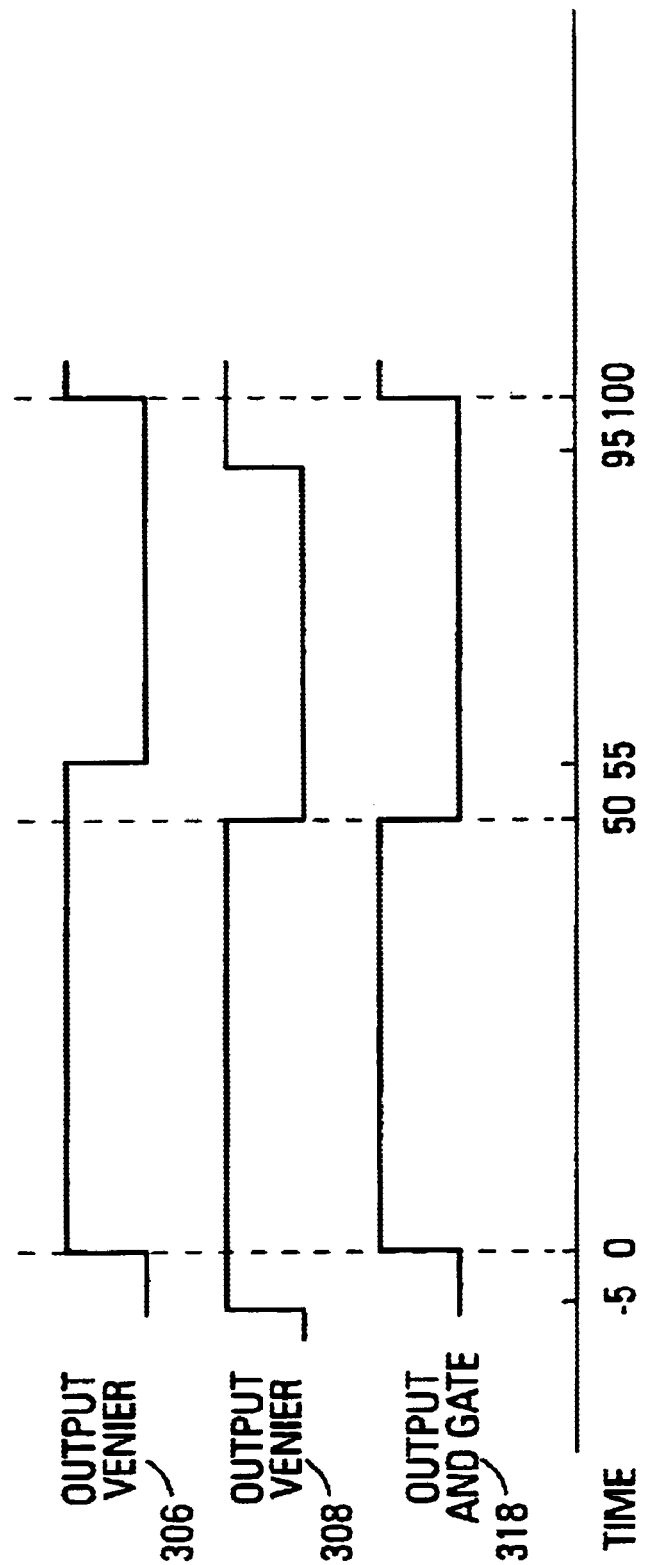

DRIVER FOR INTEGRATED CIRCUIT CHIP TESTER

TECHNICAL FIELD

The present invention relates generally to the testing of integrated circuit chips and in particular the present invention relates to a driver circuit for use on an integrated circuit tester.

BACKGROUND

Integrated circuit chips or semiconductor devices typically undergo testing to verify their operability under a variety of conditions by their manufacturer. Generally, these chips are tested by automatic test equipment called an integrated circuit tester. The integrated circuit tester can be referred to as a "tester." Chips are tested for a variety of reasons. For example, the tester may be used for sorting out faulty chips or for grading the chips on performance characteristics. In addition, a tester may be used during manufacture to guide the repair of chips that are defective. A chip that is being tested is commonly referred to as a device under test (DUT).

Generally testers include a host computer that runs software for controlling various tests on the DUT. Moreover, traditional testers contain numerous "channels" or "pins." Each channel typically includes a driver circuit to generate test signals and/or a detector circuit or comparator circuit to measure output signals. To test a DUT, selected leads or ports on the DUT are coupled to selected channels of the tester. In a typical testing scenario, one or more of the channels is programmed to simulate an input to the chip. Moreover, a receiver in one or more channels is also programmed to detect one or more expected outputs.

Traditionally, single ended channels were used in the testers because single-ended signals were traditionally used in chips. A single-ended signal comprises a single signal for conveying a digital logic state with reference to a digital ground. A single-ended signal is detected as having a high logic level, a low logic level or a logic state between a high and a low logic level (a "between" state). Problems can arise with single-ended signals during high speed operations due to interference from ground bounce, noise and cross talk.

Some modern chips running at high speeds use differential circuits to generate differential signals to convey logic states. These chips employ differential signal ports. Differential signals convey a digital logic state as differences between two signals, neither one of which is ground. The effects of ground bounce, noise and cross talk are less on high speed systems incorporating differential signals than those systems incorporating single-ended signals. Typically, a differential amplifier is used to compare the differential margin of the signals in determining the logic level. There is a need in the art for a tester that effectively tests a DUT having differential signal ports.

The channel circuitry of testers can also be programmed to generate or check for an expected signal at a precise time. For example, most chips are clocked. That is, most integrated circuits have a clock input that changes states on a periodic basis. Generally, a chip latches a set of input signals at a set time in relation to a change in the clock signal. If valid data signals are not applied to the chip at the change in the clock signal, the chip will latch improper data.

Traditionally, a common clock was used for every chip inside an electronic system. Using a common clock allows each chip to produce its output and latch its input in association with other chips in the electronic system. However, problems can occur with the common clock system when signals move through one part of the electronic system at a different rate than other parts of the electronic system. The differences in time are sometimes called "skew." When designing a system, the skew must be taken into account. Typically, the faster the electronic system, the more difficult it is to design to compensate for the skew.

More recently, a new clocking architecture has been used in systems that need to process many operations per second. This architecture is sometimes referred to as "source synchronous," "clock forwarding" or "echo clocks." In a source synchronous architecture, each chip in an electronic system that produces output signals (data signals) also produces an output clock signal (data clock signal). The data clock signal is fed to other chips in the electronic system along with the data signals. The other chip uses the data clock signal input to latch the input data signals. Because the data clock signal and the data signals travel over similar paths, there is less skew between the data signals and the data clock signal than between the data signals and the common clock. There is a need in the art for a tester that effectively tests DUT's having a source synchronous architecture.

For the reasons stated above and for the reasons stated below, which will become apparent to those skilled in the art upon reading and understanding the present specification, there is a need in the art for a tester with a driver circuit that can effectively test DUT's having differential signal ports and a source synchronous architecture.

SUMMARY

The above-mentioned problems with testers and other problems are addressed by the present invention and will be understood by reading and studying the following specification.

In one embodiment, a driver circuit is disclosed. The driver circuit comprises a timing circuit and a driver. The timing circuit has two or more inputs to receive data signals at a first frequency and at least one output. The timing circuit generates a control signal having a second higher frequency and outputs signals based on the data signals and the control signal such that the output signals are independent of the effects of timing skew and timing jitter of the data signals. The driver has at least one input coupled to the at least one output of the signal timing circuit to receive the output signals.

In another embodiment, a driver circuit for an integrated chip tester comprises a driver, a multiplexer and a timing logic circuit. The multiplexer has a plurality of data inputs for receiving test data signals. The multiplexer further has at least one control input and at least one output. The at least one output of the multiplexer is coupled to the driver. In addition, the timing logic circuit is coupled to the at least one control input of the multiplexer. The timing logic circuit controls the selection of the data inputs of the multiplexer such that an output signal of the multiplexer is independent of the effect of timing skew and timing jitter of the test data signals.

In another embodiment, a differential driver circuit for an integrated chip tester comprises a driver, a multiplexer and a timing logic circuit. The driver has a pair of inputs and a pair of outputs. The multiplexer has four inputs for receiving data signals, a pair of outputs coupled to the pair of inputs of the driver, a first selector input and a second selector input. The first and second selector inputs control the frequency in which data signals are coupled to the pair of outputs of the multiplexer. The timing logic circuit is coupled to the first and second selector inputs of the multiplexer to provide control signals. Moreover, the timing logic circuit uses a Gray code to provide a first control signal to the first selector input and a second control signal to the second selector input.

In another embodiment a test driver system comprises a memory, a data logic circuit, a multiplexer, a timing logic circuit and a driver. The memory is used to store program data. The data logic circuit is coupled to process the program data in the memory. The data logic circuit has a plurality of outputs to output a plurality of data signals. The multiplexer has an input for each output of the data logic circuit. Moreover, each input is coupled to receive an associated data signal from the data logic circuit. The multiplexer further has at least one output and at least one select input to selectively control when the data signals are coupled to the output. The timing logic circuit is coupled to the at least one select input. The timing logic circuit supplies a predetermined signal frequency to the at least one select input to control a flow of data signals out of the at least one output The driver is coupled to the at least one output of the multiplexer to drive a signal to a device under test.

In another embodiment, a test drive synchronous device for an integrated circuit tester comprises, a multiplexer, a data logic circuit, a data driver, a synchronous timing circuit and a clock driver. The multiplexer has a plurality of inputs to receive data signals, at least one output and at least one select input to selectively couple the data signals to the at least one output. The data logic circuit has an input for receiving a clock signal and at least one output coupled to the at least one select input of the multiplexer. The data logic circuit applies a control signal of a predetermined frequency to the at least one select input of the multiplexer. The data driver is coupled to the at least one output of the multiplexer to drive data signals from the multiplexer to a device under test. The synchronous timing circuit has an input to receive the clock signal and at least one output. The synchronous timing circuit outputs a clock signal of a desired frequency. A clock driver is coupled to the at least one output of the synchronous circuit to drive the clock signal to the device under test.

A method for providing test data to an electronic device, the method comprising, coupling test data signals of a first frequency to a plurality of inputs of a multiplexer and coupling a control signal of a second higher frequency to at least one select input of the multiplexer to selectively couple the test data signals to a driver such that output signals from the multiplexer are independent of the effects of timing skew and timing jitter of the test data signals.

A method for providing test data to differential signal ports of an electronic device, the method comprising applying test data signals having a first frequency to four inputs of a multiplexer, applying first and second control signals having an effective frequency higher than the first frequency to select inputs of the multiplexer, wherein the first control signal and the second control signal selectively couple the test data signals to an output of the multiplexer and coupling the output of the multiplexer and a complement of the output of the multiplexer to a driver.

Another method for providing test data to an electronic device, the method comprising, generating a plurality of test signals to be applied to a device under test, processing the plurality of test signals with a Gray code to produce a single data signal of a predetermined frequency and coupling the data signal and a complement of the data signal to the device under test.

Another method for providing test data to an electronic device, the method comprising, generating a plurality of test data signals to be applied to a device under test, processing the plurality of test data signals with a Gray code to produce a single data signal of a predetermined frequency, synchronizing a clock signal with the data signal and coupling the data signal and the clock signal to the device under test.

BRIEF DESCRIPTION OF THE DRAWINGS

FIG. 8 is a diagram illustrating an example of clock signals applied to the synchronous circuit of one embodiment of the present invention.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention relates to a driver circuit in a tester designed to test a DUT having differential signal ports and source synchronous clocking. Before the present invention is discussed in detail, further background is first provided to aid the reader understand the present invention.

Figure 1:
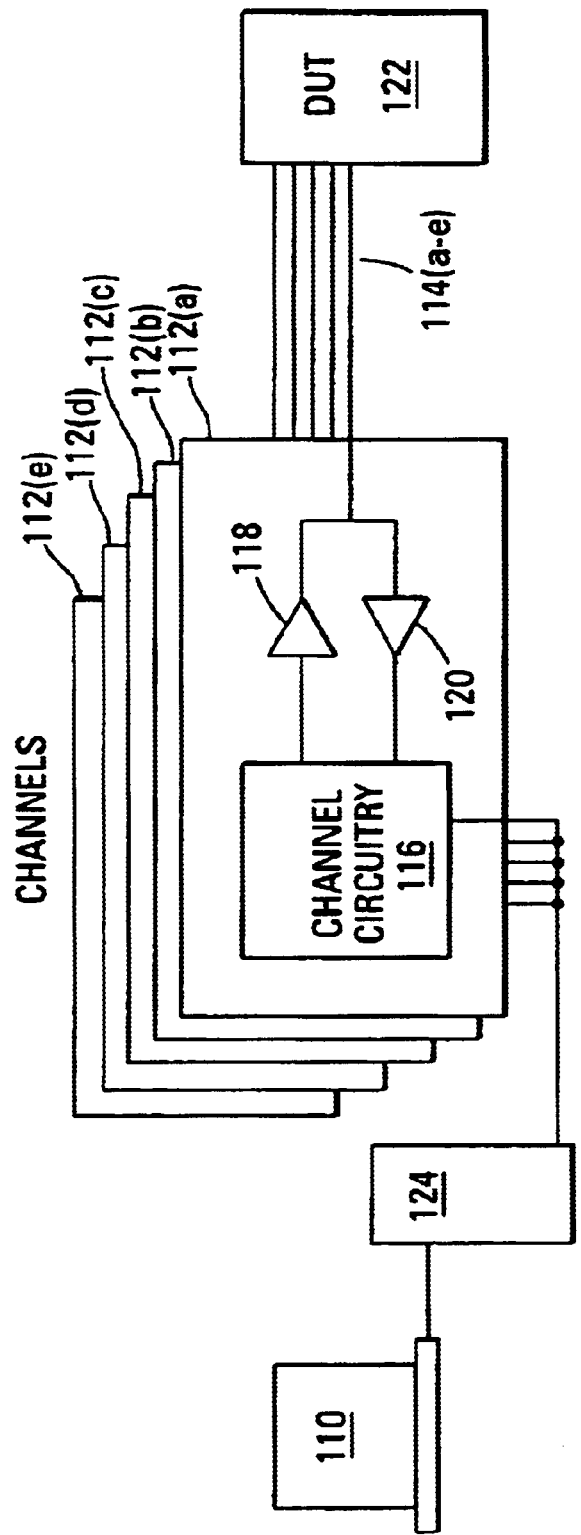
FIG. 1 is a simplified block diagram of a tester of the prior art.

Referring to FIG. 1, a simplified block diagram illustrating a tester coupled to a DUT 122 of the prior art is shown. A host computer 110 runs a test program to test the DUT 122. As shown, the host computer 110 is coupled to a diagnostic system 124. The diagnostic system 124 is coupled to a plurality of digital channels 112(a–e). More specifically, each channel 112(a–e) includes channel circuitry 116 that is coupled to the diagnostic system 124. Each channel 112 (a–e) also includes a driver 118 and a receiver 120. The receiver circuit 120 may also be referred to as a detector circuit 120. It is understood that some channels 112 may include only a driver 118 or a receiver 120. Each channel 112(a–e) further has an associated I/O terminal 114(a–e) that is selectively coupled to the DUT 122 for testing. The channel circuitry 116 typically controls the driver 118 in applying signal edges at precise instants in time, and controls the receiver circuit 120 in sampling outputs from the DUT 122 at precise instants in time.

Figure 2:
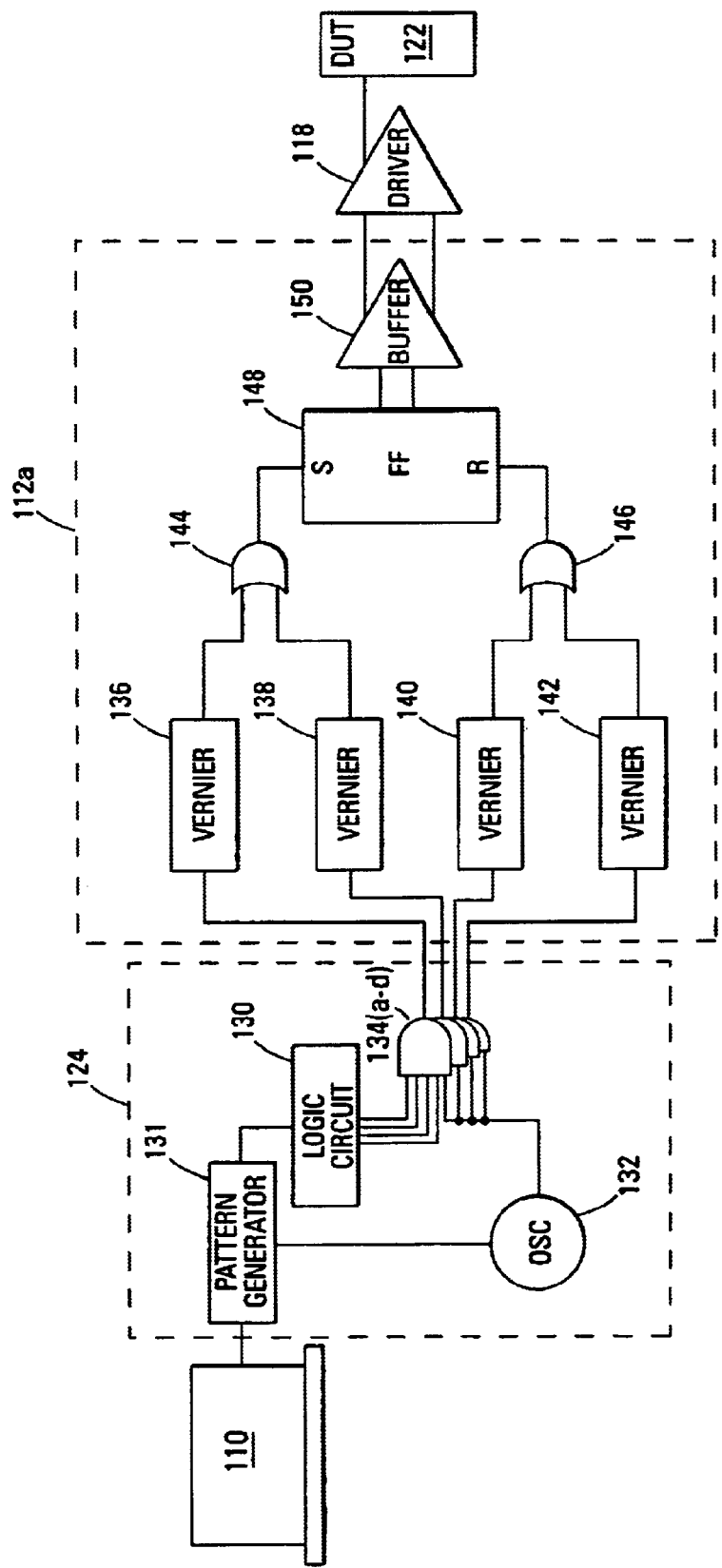
FIG. 2 is a simplified block diagram of a typical driver circuit of the prior art.

Referring to FIG. 2, a simplified diagram of relevant elements relating to a typical driver circuit of the prior art is illustrated. As shown, a host computer 110 is coupled to the diagnostic system 124 to run a diagnostic program and to supply data signals to the driver 118 during testing of a DUT 122. The host computer 110 down loads selected test patterns into a pattern generator 131. Once the selected patterns have been down loaded, the host computer 110 signals the pattern generator 131 to start. The pattern generator 131 then runs the test patterns at a speed that is programmed by the host computer 110. The speed is generally faster than the host computer 110 runs itself. Once a selected test pattern has been applied to the DUT 122, the host computer 110 verifies the DUT's performance.

Signals generated by the pattern generator 131 are received by a logic circuit 130 in the diagnostic system 124. The logic circuit 130 passes the data signals to inputs of logic gates when a predefined condition is met. The logic gates are illustrated as being AND gates 134(a–d) in this example. Moreover, although not shown, the diagnostic system 124 has a plurality of AND gates for each channel 112(a–e). The diagnostic system 124 also has an oscillator 132 to provide signal pulses. The oscillator 124 is coupled to inputs of AND gates 134(a–d) and to the pattern generator 131 to provide synchronization. AND gates 134(a–d) pass the data signal when the logic circuit 130 passes data signals and a pulse is received from the oscillator 132. Therefore, data signals output from the AND gates 134(a–d) are data dependant. That is, the output signal from the diagnostic system 124 is dependant on the data supplied by the host computer 110.

As illustrated in FIG. 2, outputs from the AND gates 134(a–d) are respectively coupled to associated vernier circuits 136, 138, 140, 142 in channel 112(a). A vernier circuit is commonly referred to as a programmable delay circuit or timing adjustment circuit. Each vernier circuit has an internal clock signal that is used to adjust the timing of signals that are output from the vernier. As shown, outputs of vernier circuits 136 and 138 are coupled to OR gate 144 to provide signals to selectively set flip flop 148. Moreover, outputs of vernier circuits 140 and 142 are coupled to OR gate 146 to selectively reset flip flop 148. An output of flip flop 148 is coupled to buffer 150. A driver circuit 118 is coupled between the buffer 150 and the DUT 122 to provide a signal to the DUT 122. The multiple vernier circuits 136, 138, 140, and 142 are used to set and reset the flip flop 148 to change the signal to the driver circuit 118. Since the signals going into the vernier circuits 136, 138, 140 and 142 are data dependant, the signal created by the flip flop 148 and passed through the driver circuit 118 are also data dependant.

Pulse shapes and reflections in transmission lines can make it difficult if not impossible, for existing tester systems to effectively test high speed circuits. Terminations of pulses in high speed signals in transmission lines approach a sinusoidal shape with increasing speed instead of square waves since the rise time of the signal consumes a large portion of the pulse duration. Further, signals transmitted over transmission lines tend to reflect back toward their source. When the reflections in the transmission lines are under a constant duty cycle, they are predictable and can be calculated out to produce a desired timing for the signals to the driver. However, when the duty cycle is varied they are difficult to predict and calculate out. With high speed signals, the duty cycle tends to be varied making it difficult to predict and calculate out reflections in the transmission lines. This can cause existing testers to produce signals with timing skew and jitter out of their data drivers when high speed signals are used. Embodiments of testers of the present invention reduce the data dependency due to timing skew and jitter in the data signals, thereby allowing the testers to work on high speed systems.

Figure 3:
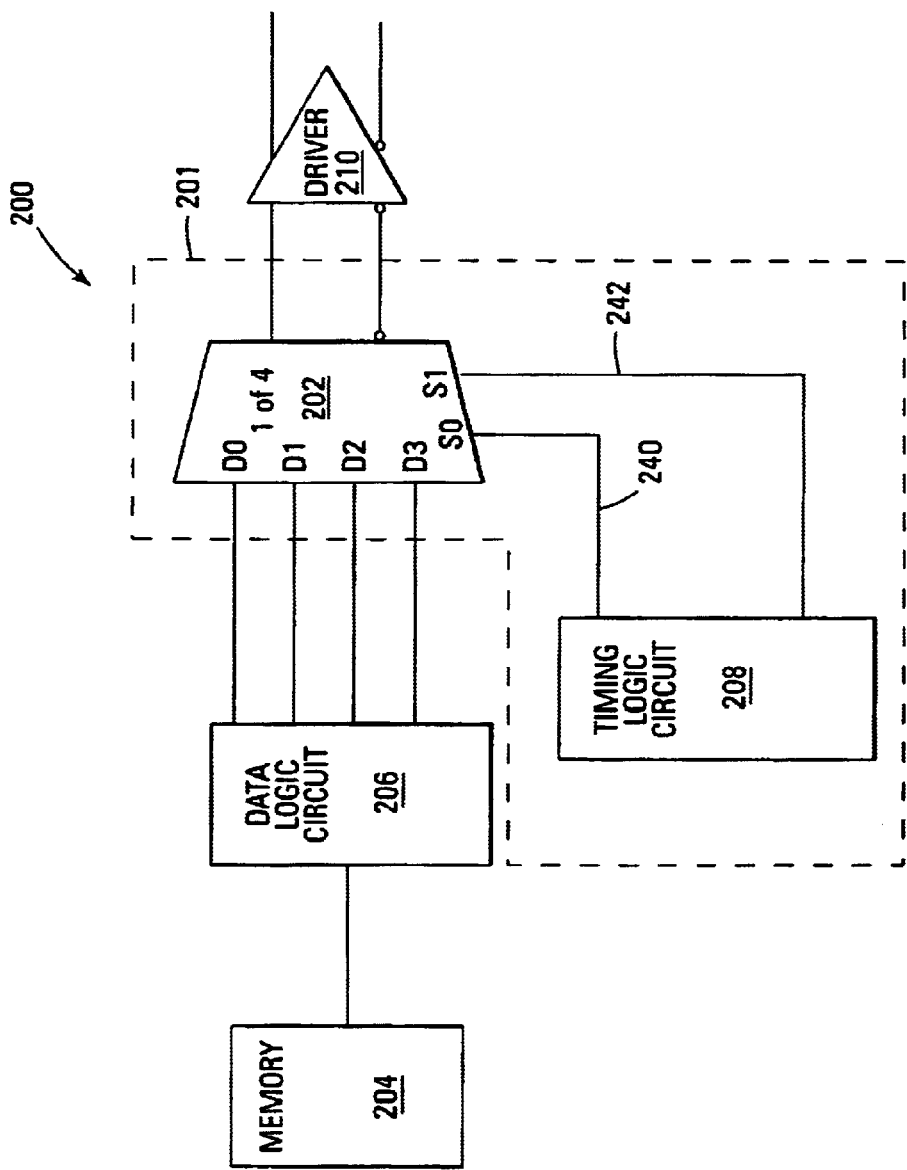
FIG. 3 is a block diagram of one embodiment of the present invention.

Referring to FIG. 3, a simplified block diagram of one embodiment of a test driver system 200 of the present invention is illustrated. As illustrated, a 1 of 4 multiplexor 202 is coupled to a data driver 210. A timing logic circuit 208 activates the multiplexer by selectively sending signals through select lines 240 and 242 to first and second select inputs S0 and S1 of the Multiplexer 202. Select inputs S0 and S1 can also be referred to as control inputs and the signals in the select lines 240 and 242 can be referred to as first and second signals. As shown, a memory 204 in a channel or pattern generator provides a data signal to a data logic circuit 206. The data logic circuit 206 selectively outputs data signals or test data signals to inputs D0, D1, D2 and D3 of the multiplexer 202. The data signal received in inputs D0, D1, D2 and D3 are passed through the multiplexer 202 in response to the signals in the select lines 240 and 242. Unlike existing systems, the present invention minimizes data dependency by eliminating the timing skew and timing jitter at data inputs D0, D1, D2 and D3 of the multiplexer 202. Although, there may be a small amount of data dependency in an output signal from the multiplexer 202 (due to an output transistor in multiplexer 202, not shown), data dependency will not come from input data signals or from signals in the select lines 240 and 242. The multiplexer 202 and the timing logic circuit 208 of FIG. 3 can be referred to as a timing circuit 201.

As illustrated in FIG. 3, in one embodiment, multiplexer 202 couples an output signal and a complementary output signal to the driver 210. The output signal and the complementary output signal are used as differential signals when testing a DUT having differential signal architecture. Driver 210 couples the output signal and the complementary output signal to differential signal ports of the DUT (not shown).

In one embodiment, select inputs S0 and S1 of the multiplexer 202 use a Gray code in selecting among inputs D0, D1, D2 and D3. A Gray code is a modified binary code designed to avoid logic hazards. A logic hazard defines a situation when the states of two bits have to be flipped at the same time to produce a specific value. This situation lends itself to errors because it is difficult to get the bits to flip at the exact same time. For example, if the signals have different path lengths to travel to reach switches that control the bits, they will arrive at slightly different times in flipping the switches and an intermittent erroneous state will temporally be produced. A logic hazard occurs when you go from a binary 1 to a binary 2. An example of a Gray code is illustrated in table 1.

TABLE 1

GRAY CODE

| Decimal Value | S0 | S1 |
|---|---|---|
| 0 | 0 | 0 |
| 1 | 0 | 1 |
| 3 | 1 | 1 |
| 2 | 1 | 0 |

As table 1 illustrates, the Gray code eliminates the requirement of flipping two bits at the same time by counting 0, 1, 3, 2. The timing logic circuit 208 implements the Gray code in sending signals through the select lines 240 and 242 to select inputs S0 and S1 of the multiplexer 202. An illustration of the implementation of the Gray code on select inputs S0 and S1 is provided in table 2.

TABLE 2

GRAY CODE TIMING

| TIME | T0 | T1 | T2 | T3 | T4 | T5 | T6 |
|---|---|---|---|---|---|---|---|
| S0 | 0 | 1 | 1 | 0 | 0 | 1 | 1 |
| S1 | 0 | 0 | 1 | 1 | 0 | 0 | 1 |

Figure 4:
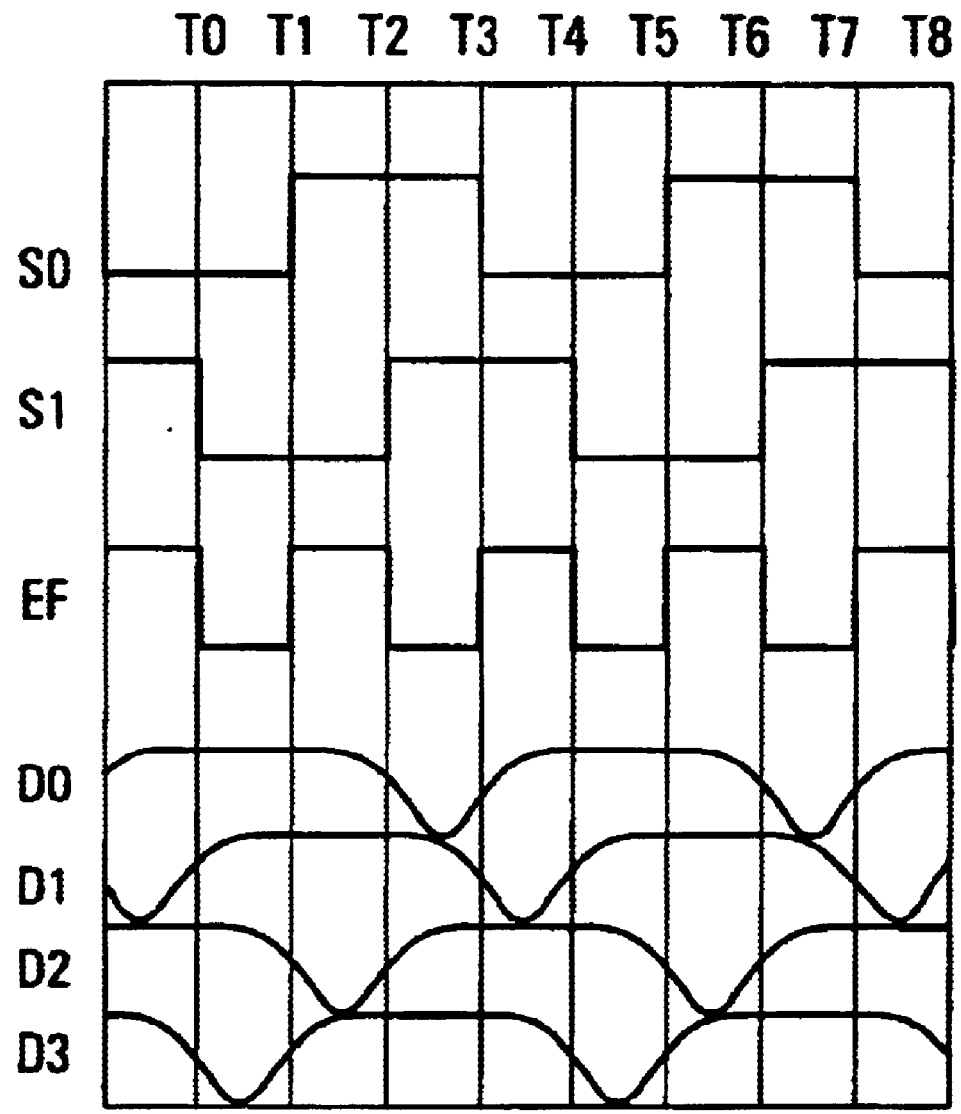
FIG. 4 is a diagram illustrating signals provided to the select inputs of the multiplexer and an example output of the multiplexer of one embodiment of the present invention.

Referring to FIG. 4, a timing diagram that illustrates the relationship between signals coupled to the multiplexer 202. As shown, the timing logic circuit couples a first signal to select input S0 and a second signal to select input S1. The first and second signals applied respectively to select input S0 and select input S1 result in an effective frequency EF of the combined first and second select signals as shown. The effective frequency EF is the frequency in which data signals are output from the multiplexer 202. As shown, the frequencies of the first and second signals are approximately ½ of the frequency of the effective frequency EF. Running the first and second signals at half the frequency of the effective frequency EF is desired because it spreads the leading edge of a signal pulse away from the trailing edge signal pulse thereby reducing the effects of reflections in the transmission lines.

FIG. 4 also illustrates the effect of the Gray code on data signals coupled to data inputs D0, D1, D2 and D3. As illustrated, data signals coupled to D3 are sampled before data signals in D2. The timing diagram also illustrates when the data signals are sampled in relation to the effective frequency EF. Further clarification of when the data signals are sampled in relation to the first and second signals respectfully coupled to select inputs S0 and S1 is shown in table 3

TABLE 3

| DATA INPUT | WHEN SAMPLED |
|---|---|
| D0 | T0–T1 |
| D1 | T1–T2 |
| D2 | T3–T4 |
| D3 | T2–T3 |

Referring to FIG. 4, the data signals coupled to the data inputs D0, D1, D2 and D3 are sampled when they are the most stable. That is, the data signals are sampled during a middle portion of a pulse thereby avoiding transition or rise time of the pulse. Moreover, the data signals coupled to the data inputs D0, D1, D2 and D3 run at approximately ¼ the frequency of the signal output from the multiplexer 202. This spreading out of the signal pulse further allows an accurate sample of the data signal coupled to a respective data input D0, D1, D2 and D3 to be read. This also allows the test data to be generated with lower cost, low speed components. Moreover, the method eliminates from an output signal of the multiplexer 202, timing skew and jitter associated with data signals coupled to data inputs D0, D1, D2 and D3. The pulses in the data signals coupled to data inputs D0, D1, D2, and D3 in FIG. 4 are all shown as conveying high logic states. This is merely done for illustration purposes and it will be realized by those in the art that actual data signals will also contain pulses representing low logic states.

Figure 5:
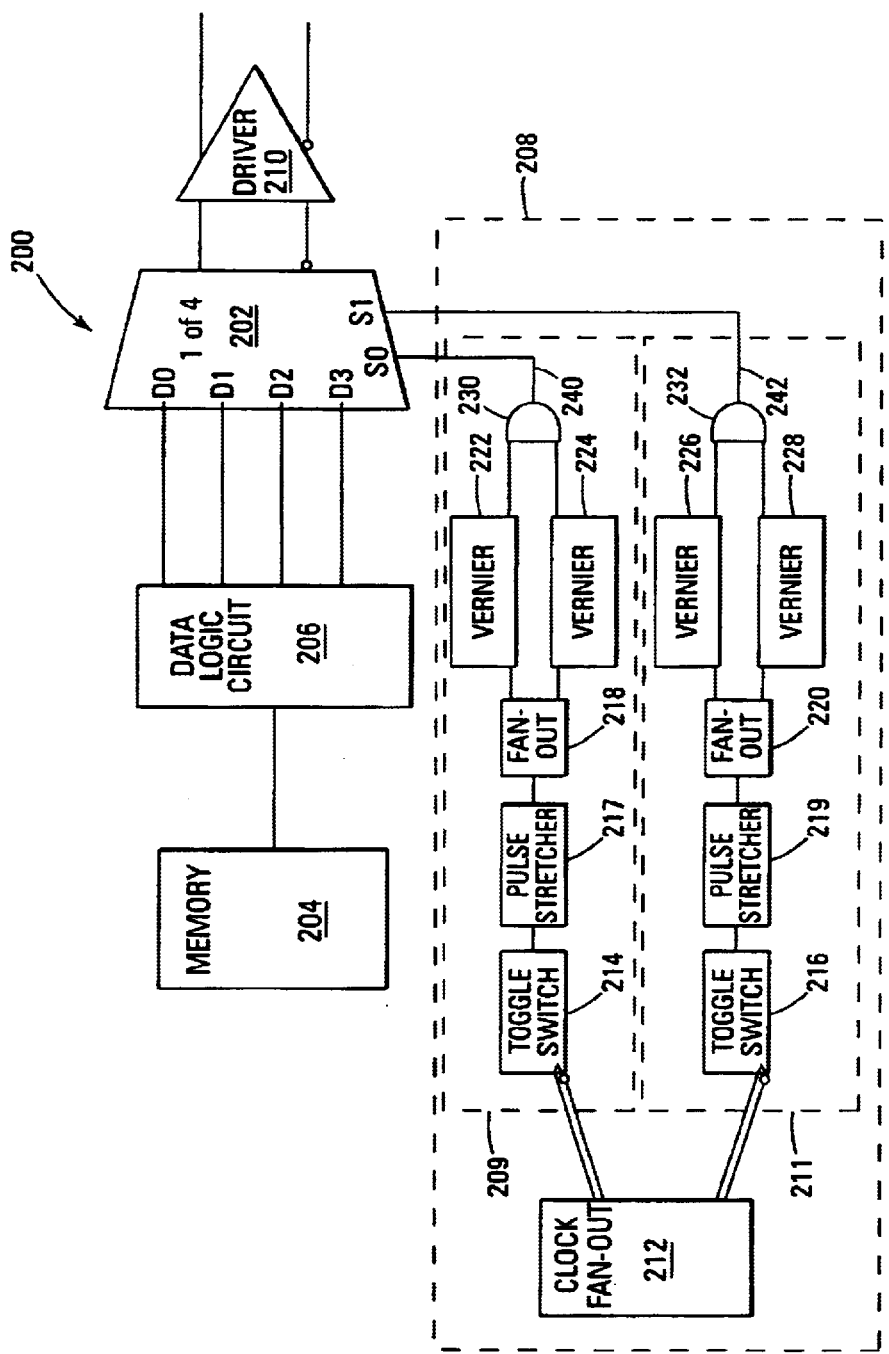
FIG. 5 is a schematic diagram of the timing logic circuit of one embodiment of the present invention.

Referring to FIG. 5, one embodiment of the timing logic circuit 208 is illustrated. As illustrated, a clock fan-out circuit 212 is used to generate clock pulses of a given frequency from a clock 203. The clock fan-out circuit is coupled to a first pulse generator 209 and a second pulse generator 211. The first pulse generator 209 has a toggle switch 214 or toggle flip-flop switch that cuts the frequency of the clock pulses from the clock fan out circuit 212 in half. An output of toggle switch 214 is coupled to pulse stretcher circuit 217. Pulse stretcher circuit 217 is used adjust the length of the clock pulses as needed to create a desired shape. An output of pulse stretcher circuit 217 is coupled to fan-out circuit 218. Fan-out circuit 218 provides a signal to verniers 222 and 224. Verniers 222 and 224 are used to adjust the timing of the signal. Moreover, Verniers 222 and 224 are coupled to AND gate 230. The toggle switch 214, fan-out circuit 218, verniers 222 and 224 and AND gate 230 generate the first signal or first control signal that is coupled to select input S0 of the multiplexer 202. More specifically, vernier 222 is used to adjust the leading edge of pulses in the first signal and vernier 224 is used to adjust the trailing edge of pulses in the first signal.

The second pulse generator 211 has a toggle switch 216 or toggle flip-flop switch that cuts the frequency of the clock pulses from the clock fan out circuit 212 in half. As shown, the toggle switch 216 is coupled to receive a clock signal that is 180° out of phase with the clock signal received by toggle switch 214 in the first pulse generator 209. An output of toggle switch 216 is coupled to pulse stretcher circuit 219. Pulse stretcher circuit 219 is used adjust the length of the clock pulses as needed to create a desired shape. An output of pulse stretcher circuit 219 is coupled to fan-out circuit 220. Fan-out circuit 220 provides a signal to verniers 226 and 228. Verniers 226 and 228 are used to adjust the timing of the clock signal. Moreover, verniers 226 and 228 are coupled to AND gate 232. The toggle switch 216, fan-out circuit 220, verniers 226 and 228 and AND gate 232 generate the second signal or second control signal to select input S1 of the multiplexer 202. More specifically, vernier 226 is used to adjust the leading edge of pulses in the second signal and vernier 228 is used to adjust the trailing edge of pulses in the second signal.

Figure 6:
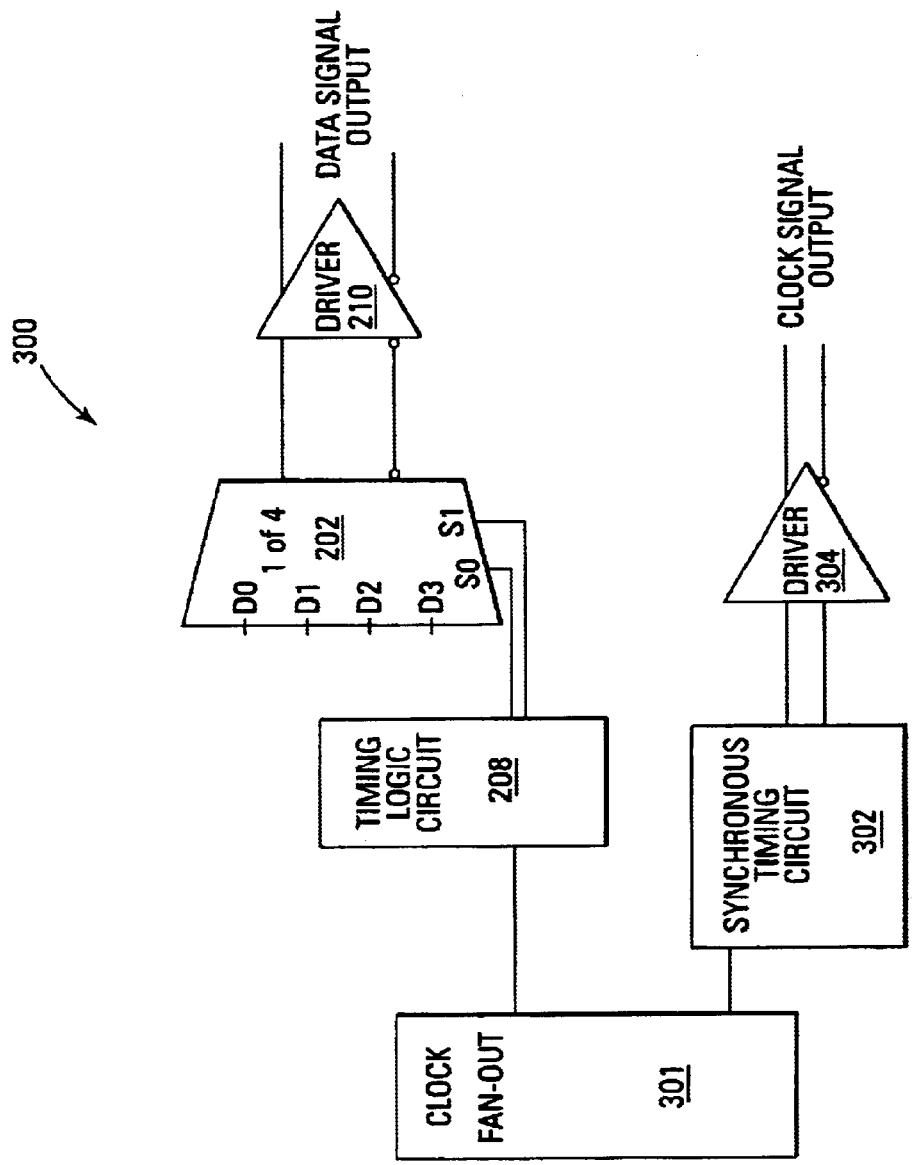
FIG. 6 is a block diagram of one embodiment of a drive circuit for a tester that operates on systems that use synchronous signals.

FIG. 6 illustrates an embodiment of a drive circuit for testing a system that uses synchronous signals, indicated generally at 300. As with the previous embodiments, this embodiment uses the timing logic circuit 208 to control inputs S0 and S1 of multiplexer 202 to reduce data dependency. Moreover, in this embodiment, a clock fan-out circuit 301 is coupled to the timing logic circuit 208 and a synchronous timing circuit 302. The synchronous timing circuit 302 outputs a timing signal to a clock driver 304. The clock driver 304 then outputs a timing signal to a DUT being tested that has source synchronous architecture.

Figure 7:
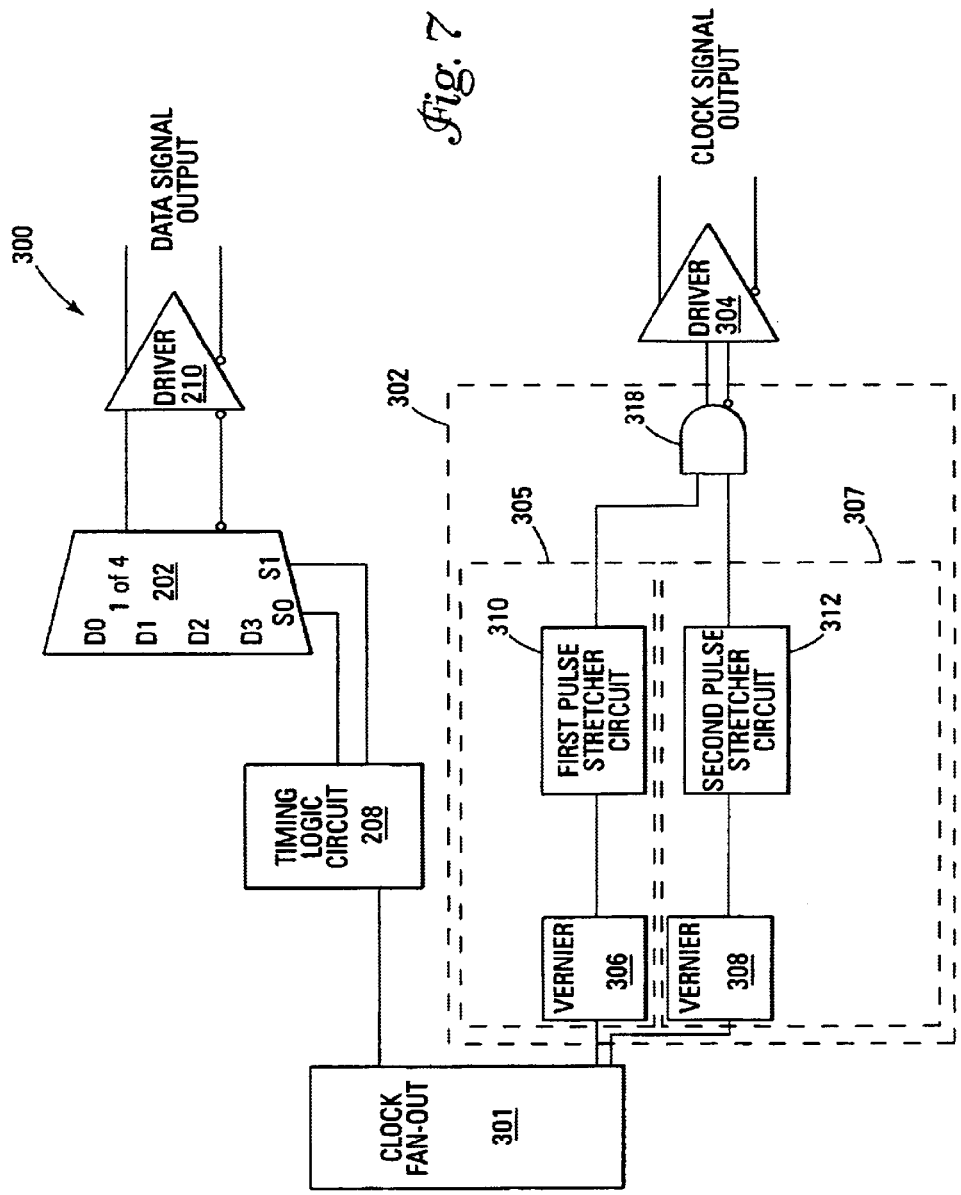
FIG. 7 is a schematic diagram of a synchronous timing circuit of one embodiment of the present invention.

A detailed illustration of the synchronous timing circuit is illustrated in FIG. 7. As illustrated, the clock fan-out circuit 301 outputs clock signals to a first duty cycle adjust circuit 305 and a second duty cycle adjust circuit 307. Vernier 306 of the first duty cycle adjust circuit 305 outputs a clock signal to a first pulse stretcher circuit 310. Vernier 306 is used to create a leading edge of a pulse and the first pulse stretcher 310 is used to adjust the length of pulses as needed to create a desired shape. An output of the first pulse stretcher circuit 310 is coupled to an input of AND gate 318.

Vernier 308 of the second duty cycle adjust circuit 307 outputs a clock signal to a second pulse stretcher circuit 312. Vernier 308 is used to create a trailing edge of a pulse and the second pulse stretcher 312 is used to adjust the length of pulses as needed to create a desired shape. An output of the second duty cycle adjust circuit 307 is coupled to another input of AND gate 318. An output of AND gate 318 is coupled to clock driver 304 to provide the desired shape and timing relationship to the data signal output of driver 210. Accordingly, the first and second duty cycle adjust circuits 305 and 307 are used to individually to adjust the leading and trailing edge of a signal output from AND gate 318 to form a desired clock signal. This is desired because the clock signal from the clock fan-out circuit 301 may have a shape that varies in pulse widths. Vernier circuits 306 and 308 may be referred to as programmable delay circuits 306 and 308.

To provide a better understanding of the synchronous timing circuit 302, an example of an application of the synchronous timing circuit 302 on clock signals having a 50% duty cycle is illustrated in FIG. 8. In this example, the clock fan-out circuit provides a pulse cycle that is 55% positive or high and 45% negative or low. The units of time are not specified in this example because they are not relevant to understanding how the synchronous timing circuit 302 performs and are selected based on the implementation. As illustrated, the signal output from vernier 306 forms the leading edge of the output of AND gate 318 at time 0. Vernier 308 shifts the pulse signal back to time −5 to form the trailing edge of the output of AND gate 318 at time 50. Vernier 306 then forms the leading edge of the output pulse of AND gate 318 at time 100. In this way, the synchronous circuit 302 forms the desired clock signal. In addition, had the clock fan out circuit 301 provided a clock signal with a duty cycle that could not be shifted by the verniers 307 and 308 to produce the desired signal shape, the pulse stretcher circuits 310 and 312 would have extended or retracted the positive pulse percentage to achieve the desired clock shape.

Although, various embodiments have been illustrated using a 4 to 1 multiplexer it will be understood in the art that other multiplexers could be implemented and that the present invention is not limited to 4 to 1 multiplexers. Moreover, it will also be understood in the art that the present invention could be applied to a driver circuit not testing a DUT having differential signal ports. Therefore, the present invention is not limited to a driver circuit for testing differential signal ports.

Conclusion

A driver circuit for use on an integrated circuit tester is disclosed. In one embodiment, the driver circuit has a timing circuit and a driver. The timing circuit has two or more inputs to receive data signals at a first frequency and at least one output. The timing circuit generates a control signal having a second higher frequency and outputs signals based on the data signals and the control signal such that the output signals are independent of the effects of timing skew and timing jitter of the data signals. The driver has at least one input coupled to the at least one output of the timing circuit to receive the output signals and couple the output signals to a device under test.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A driver circuit comprising:
   a timing circuit having two or more inputs to receive data signals at a first frequency and an at least one output, wherein the timing circuit generates a control signal having a second higher frequency and outputs signals based on the data signals and the control signal such that the output signals are independent of the effects of timing skew and timing jitter of the data signals; and
   a driver having at least one input coupled to the at least one output of the timing circuit to receive the output signals.

2. The driver circuit of claim 1 wherein the timing circuit comprises:
   a multiplexer having two or more data inputs to receive the data signals, the multiplexer further having at least one select input to selectively couple the data signals to the output of the timing circuit; and
   a timing logic circuit coupled to the at least one select input of the multiplexer to provide the control signal.

3. The driver circuit of claim 2 wherein the multiplexer has N number of select inputs and $2^N$ number of data inputs.

4. The driver circuit of claim 2 wherein the multiplexer has four data inputs, a first select input and a second select input, further wherein the timing logic circuit has a first output coupled to the first select input of the multiplexer and a second output coupled to the second select input of the multiplexer.

5. The driver circuit of claim 4 wherein the timing logic circuit implements a Gray code in selecting among the data inputs.

6. A driver circuit for an integrated chip tester comprising:
   a driver;
   a multiplexer having a plurality of data inputs for receiving test data signals, the multiplexer further having at least one control input and at least one output, the at least one output of the multiplexer is coupled to the driver; and
   a timing logic circuit coupled to the at least one control input of the multiplexer, wherein the timing logic circuit controls the selection of the data inputs of the multiplexer such that an output signal of the multiplexer is independent of the effect of timing skew and timing jitter of the test data signals.

7. The driver circuit for an integrated chip tester of claim 6 wherein the multiplexer has four data inputs.

8. The driver circuit for an integrated chip tester of claim 6 wherein the driver has a pair of inputs coupled to a pair of outputs of the multiplexer.

9. The driver circuit for an integrated chip tester of claim 6 wherein the frequency of each test data signal is approximately ¼ the frequency of the output signal of the multiplexer.

10. The driver circuit of claim 6 wherein the multiplexer has a first control input and a second control input.

11. The driver circuit for an integrated chip tester of claim 10 wherein the timing logic circuit implements a Gray code to selectively couple pulses of a predetermined frequency to the first control input and the second control input of the multiplexer.

12. The driver circuit for an integrated chip tester of claim 10 wherein the frequency of the pulses coupled to the first control input and the frequency of the pulses coupled to the second control input are approximately ½ the frequency of a signal output from the multiplexer.

13. A differential driver circuit for an integrated chip tester comprising:
   a driver having a pair of inputs and a pair of outputs;
   a multiplexer having four inputs for receiving data signals, a pair of outputs coupled to the pair of inputs of the driver, a first selector input and a second selector input, wherein the first and second selector inputs control the frequency in which data signals are coupled to the pair of outputs of the multiplexer; and
   a timing logic circuit coupled to the first and second selector inputs of the multiplexer to provide control signals, wherein the timing logic circuit uses a Gray code to provide a first control signal to the first selector input and a second control signal to the second selector input.

14. The differential driver circuit for an integrated chip tester of claim 13 wherein the outputs of multiplexer are complementary to provide a differential signal.

15. The differential driver circuit for an integrated chip tester 13 wherein the timing logic circuit comprises:
   a clock fan-out circuit to provide a clock signal;
   a first pulse generator coupled to the clock fan-out circuit to generate the first control signal; and
   a second pulse generator coupled to the clock fan-out circuit to generate the second control signal.

16. The differential driver circuit for an integrated chip tester of claim 15 wherein the first pulse generator comprises:
   a toggle switch coupled to the clock fan-out circuit to decrease the frequency of the clock signal by half;
   a pulse stretcher circuit coupled to an output of the toggle switch; wherein the pulse stretcher adjusts the length of clock pulses in the clock signal to create a desired shape;
   a fan circuit coupled to an output of the pulse stretcher, the fan circuit having a first output and a second output;
   a first vernier coupled to the first output of the fan circuit to adjust the timing of a leading edge of a pulse in a signal;
   a second vernier coupled to the second output of the fan circuit to adjust the timing of a trailing edge of a pulse in the signal; and
   an AND gate having a first input coupled to an output of the first vernier and a second input coupled to an output of the second vernier, the AND gate further having an output coupled to the first selector input of the multiplexer.

17. The differential driver circuit for an integrated chip tester of claim 15 wherein the second pulse generator comprises:
   a toggle switch coupled to the clock fan-out circuit to decrease the frequency of the clock signal by half and invert the clock signal by 180 degrees;
   a pulse stretcher circuit coupled to an output of the toggle switch; wherein the pulse stretcher adjusts the length of clock pulses in the clock signal to create a desired shape;
   a fan circuit coupled to an output of the pulse stretcher, the fan circuit having a first output and a second output;
   a first vernier coupled to the first output of the fan circuit to adjust the timing of a leading edge of a pulse in a signal;
   a second vernier coupled to the second output of the fan circuit to adjust the timing of a trailing edge of a pulse in the signal; and
   an AND gate having a first input coupled to an output of the first vernier and a second input coupled to an output of the second vernier, the AND gate further having an output coupled to the second selector input of the multiplexer.

18. A test driver system comprising:
   a memory to store program data;
   a data logic circuit coupled to process the program data in the memory, the data logic circuit having a plurality of outputs to output a plurality of data signals;
   a multiplexer having an input for each output of the data logic circuit, each input is coupled to receive an associated data signal from the data logic circuit, the multiplexer further having at least one output and at least one select input to selectively control when the data signals are coupled to the output;
   a timing logic circuit coupled to the at least one select input, wherein the timing logic circuit supplies a predetermined signal frequency to the at least one select input to control a flow of data signals out of the at least one output; and
   a driver coupled to the at least one output of the multiplexer to drive a signal to a device under test.

19. The test driver system of claim 18 wherein the timing logic circuit comprises:
   a clock fan-out circuit to provide a clock signal;
   a first pulse generator coupled to the clock-fan out circuit, wherein the first pulse generator reduces the frequency of the clock signal by approximately half and applies the half frequency clock signal to a first select input of the multiplexer; and
   a second pulse generator coupled to the clock fan-out circuit, wherein the second pulse generator reduces the frequency of the clock signal by approximately half and applies the half frequency clock signal to a second select input of the multiplexer.

20. The test driver system of claim 18 wherein the multiplexer has N number of select inputs and $2^N$ number of inputs to receive data signals.

21. The test driver system of claim 18 wherein the timing logic circuit uses a Gray code to create the predetermined frequency.

22. The test driver system of claim 18 wherein the driver has a pair of complementary inputs and a pair of complementary outputs to provide a differential signal.

23. A test drive synchronous device for an integrated circuit tester comprising:
   a multiplexer having a plurality of inputs to receive data signals, at least one output and at least one select input to selectively couple the data signals to the at least one output;
   a timing logic circuit having an input for receiving a clock signal and at least one output coupled to the at least one select input of the multiplexer, wherein the timing logic circuit applies a control signal of a predetermined frequency to the at least one select input of the multiplexer;

a data driver coupled to the at least one output of the multiplexer to drive data signals from the multiplexer to a device under test;

a synchronous timing circuit having an input to receive the clock signal and at least one output, wherein the synchronous timing circuit outputs a clock signal having a desired pulse shape and a desired timing relationship with the data signals; and a clock driver coupled to the at least one output of the synchronous circuit to drive the clock signal to the device under test.

24. The test drive synchronous device for an integrated circuit tester of claim 23 further comprising:

a clock fan-out circuit coupled to provide the clock signal to the data logic circuit and the synchronous timing circuit.

25. The test drive synchronous device for an integrated circuit tester of claim 23 wherein the data logic circuit uses a Gray code to create the control signal.

26. The test drive synchronous device for an integrated circuit tester of claim 23 wherein the data driver has a pair of complementary inputs and a pair of complementary outputs to provide differential testing.

27. The test drive synchronous device of claim 24 wherein the synchronous timing circuit comprises:

a first duty cycle adjust circuit coupled to receive the clock signal from the clock fan-out circuit to provide a leading edge of signal pulses;

a second duty cycle adjust circuit also coupled to receive the clock signal from the clock fan-out circuit to provide a trailing edge of signal pulses; and an AND gate having an input coupled to an output of the first duty cycle adjust circuit and another input coupled to an output of the second duty cycle adjust circuit, wherein the AND gate outputs the clock signal having the desired pulse shape and the desired timing relationship with the data signals to the clock driver.

28. The test drive synchronous device for an integrated circuit tester of claim 27 wherein the first duty cycle adjust circuit comprises:

a programmable delay circuit coupled to receive the clock signal from the clock fan-out circuit; and a pulse stretcher circuit coupled between the programmable delay and the AND gate to selectively manipulate pulse shapes.

29. The test drive synchronous device for an integrated circuit tester of claim 27 wherein the second duty cycle adjust circuit comprises:

a programmable delay circuit coupled to receive the clock signal from the clock fan-out circuit; and a pulse stretcher circuit coupled between the programmable delay and the AND gate to selectively manipulate pulse shapes.

30. A method for providing test data to an electronic device, the method comprising:

coupling test data signals of a first frequency to a plurality of inputs of a multiplexer; and coupling a control signal of a second higher frequency to at least one select input of the multiplexer to selectively couple the test data signals to a driver such that output signals from the multiplexer are independent of the effects of timing skew and timing jitter of the test data signals.

31. The method of claim 30 wherein coupling a control signal of a second higher frequency to at least one select input of the multiplexer, further comprises:

applying a clock signal to a plurality of timing adjustment circuits that logically implement a Gray code to produce the control signal.

32. The method of claim 30 further comprising:

coupling the driver to a device under test.

33. A method for providing test data to differential signal ports of an electronic device, the method comprising:

applying test data signals having a first frequency to four inputs of a multiplexer;

applying first and second control signals having an effective frequency higher than the first frequency to select inputs of the multiplexer, wherein the first control signal and the second control signal selectively couple the test data signals to an output of the multiplexer; and coupling the output of the multiplexer and a complement of the output of the multiplexer to a driver.

34. The method of claim 33 wherein the output of the multiplexer is not dependant on the timing skew and timing jitter of the test data signals.

35. The method of claim 33 wherein a Gray code is used in creating the first control signal and the second control signal.

36. A method for providing test data to an electronic device, the method comprising:

generating a plurality of test signals to be applied to a device under test;

processing the plurality of test signals with a Gray code to produce a single data signal of a predetermined frequency; and coupling the data signal and a complement of the data signal to the device under test.

37. The method of claim 36 wherein processing the plurality of test signals with a Gray code to produce a signal of a predetermined frequency comprises:

coupling the plurality of test signals to a plurality of inputs of a multiplexer; and applying a signal of a predetermined frequency to at least one select input of the multiplexer to selectively combine the plurality of test signals using the Gray code.

38. The method of claim 37 wherein the multiplexer has four data inputs to receive four test signals and first and second select inputs.

39. A method for providing test data to an electronic device, the method comprising:

generating a plurality of test data signals to be applied to a device under test;

processing the plurality of test data signals with a Gray code to produce a single data signal of a predetermined frequency;

generating a clock signal of a predetermined frequency; and coupling the data signal and the clock signal to the device under test.

40. The method of claim 39 further comprising coupling a complement of the data signal to the device under test to provide a differential input.

41. The method of claim 39 wherein the data signal is independent of the effects of timing skew and timing jitter of the test data signals.

42. A synchronous test driver comprising:

a data driver circuit for driving data signals to a device under test;

a clock fan-out circuit to provide a clock signal;

a first duty cycle adjust circuit coupled to receive the clock signal from the clock fan-out circuit to provide a leading edge of signal pulses, wherein the first duty cycle adjust circuit includes:
  a first programmable delay circuit coupled to receive the clock signal from the clock fan-out circuit, and
  a first pulse stretcher circuit coupled to the programmable delay to selectively manipulate pulse shapes;
a second duty cycle adjust circuit also coupled to receive the clock signal from the clock fan-out circuit to provide a trailing edge of signal pulses, wherein the second duty cycle adjust circuit includes:
  a second programmable delay circuit coupled to receive the clock signal from the clock fan-out circuit, and
  a second pulse stretcher circuit coupled to the programmable delay to selectively manipulate pulse shapes;
an AND gate having an input coupled to the first pulse stretcher of the first duty cycle adjust circuit and another input coupled to the second pulse stretcher of the second duty cycle adjust circuit, wherein the AND gate outputs clock signals having the desired pulse shape and the desired timing relationship with the data signals; and
a clock driver coupled to the output of the AND gate to drive clock signal outputs to the device under test.

43. The synchronous test driver of claim 42 wherein the data driver circuit comprises:
  a driver;
  a multiplexer having a plurality of data inputs for receiving test data signals, the multiplexer further having at least one control input and at least one output, the at least one output of the multiplexer is coupled to the driver; and
  a timing logic circuit coupled to the at least one control input of the multiplexer, wherein the timing logic circuit controls the selection of the data inputs of the multiplexer such that an output signal of the multiplexer is independent of the effect of timing skew and timing jitter of the test data signals.

44. The synchronous test driver of claim 43 wherein the multiplexer has a first control input and a second control input.

45. The synchronous test driver of claim 44 wherein the timing logic circuit implements a Gray code to selectively couple pulses of a predetermined frequency to the first control input and the second control input of the multiplexer.

* * * * *